(12) United States Patent
Izawa

(10) Patent No.: US 12,264,265 B2
(45) Date of Patent: Apr. 1, 2025

(54) CONCENTRATED LIQUID OF POLISHING COMPOSITION AND POLISHING METHOD USING SAME

(71) Applicant: FUJIMI INCORPORATED, Aichi (JP)

(72) Inventor: Yoshihiro Izawa, Aichi (JP)

(73) Assignee: FUJIMI INCORPORATED, Aichi (JP)

(*) Notice: Subject to any disclaimer, the term of this patent is extended or adjusted under 35 U.S.C. 154(b) by 798 days.

(21) Appl. No.: 17/343,944

(22) Filed: Jun. 10, 2021

(65) Prior Publication Data

US 2022/0025213 A1 Jan. 27, 2022

(30) Foreign Application Priority Data

Jun. 18, 2020 (JP) .................. 2020-105176

(51) Int. Cl.
- *C09G 1/02* (2006.01)
- *B24B 19/22* (2006.01)
- *H05K 3/26* (2006.01)

(52) U.S. Cl.
CPC ............ *C09G 1/02* (2013.01); *B24B 19/22* (2013.01); *H05K 3/26* (2013.01)

(58) Field of Classification Search
CPC . C09G 1/02; B24B 19/22; H05K 3/26; H05K 2201/0248; H05K 2203/025; H05K 3/0055; H05K 2203/0789; H01L 21/30625

See application file for complete search history.

(56) References Cited

U.S. PATENT DOCUMENTS

| | | | | |
|---|---|---|---|---|
| 4,956,015 A * | 9/1990 | Okajima | ............... | C09G 1/02 106/3 |
| 6,037,260 A * | 3/2000 | Tsai | ............... | C09K 3/1463 451/36 |
| 6,440,187 B1 * | 8/2002 | Kasai | ............... | C01F 7/448 106/3 |
| 6,604,987 B1 * | 8/2003 | Sun | ............... | C23F 3/00 451/60 |
| 8,518,135 B1 * | 8/2013 | Lorpitthaya | ............... | C09G 1/02 438/692 |
| 9,862,863 B2 * | 1/2018 | Iwata | ............... | C09K 3/1463 |
| 2003/0171072 A1 * | 9/2003 | Ward | ............... | B24B 37/044 451/28 |
| 2005/0003746 A1 * | 1/2005 | Fujii | ............... | C09K 3/1463 451/41 |
| 2007/0149097 A1 * | 6/2007 | Fujii | ............... | G11B 5/8404 451/41 |
| 2008/0057716 A1 * | 3/2008 | Yamashita | ............... | C23F 3/00 438/693 |
| 2015/0291851 A1 * | 10/2015 | Asano | ............... | C09G 1/02 451/28 |
| 2016/0244639 A1 * | 8/2016 | Li | ............... | C09K 3/1463 |

FOREIGN PATENT DOCUMENTS

| | | | |
|---|---|---|---|
| CN | 101654599 A | * | 2/2010 |
| JP | 2001-49031 A | | 2/2001 |
| JP | 2007-63442 A | | 3/2007 |
| JP | 2016-183212 A | | 10/2016 |

OTHER PUBLICATIONS

Holkova et al., "Relation among the Aggregation of Boehmite Particles in Sols", Slovak Academy of Sciences. (Year: 2002).*
CN-101654599-A, Machine Translation. (Year: 2024).*
First Office Action from CN 202110638137.x, with a mailing date of Nov. 29, 2023.
Office Action from TW Application No. 110118791, with a mailing date of Sep. 10, 2024.

* cited by examiner

*Primary Examiner* — Duy Vu N Deo
*Assistant Examiner* — Christopher Remavege
(74) *Attorney, Agent, or Firm* — Katten Muchin Rosenman LLP

(57) ABSTRACT

An object of the present invention is to provide a unit capable of improving redispersibility in a concentrated liquid of a polishing composition containing alumina as abrasive grains. There is provided a concentrated liquid of a polishing composition which includes: particulate alumina; colloidal alumina having an aspect ratio of more than 5 and 800 or less; at least one phosphorus-containing acid selected from the group consisting of phosphoric acid, phosphoric acid condensates, organic phosphoric acids, phosphonic acids, and organic phosphonic acids; and water, where a pH of the concentrated liquid of the polishing composition is 2 or more and 4.5 or less.

16 Claims, No Drawings

CONCENTRATED LIQUID OF POLISHING COMPOSITION AND POLISHING METHOD USING SAME

CROSS-REFERENCE TO RELATED APPLICATION

This application claims priority to Japanese Patent Application No. 2020-105176 filed Jun. 18, 2020, which is incorporated herein by reference in its entirety.

BACKGROUND

1. Technical Field

The present invention relates to a concentrated liquid of a polishing composition and a polishing method using the same.

2. Description of Related Arts

In recent years, new microfabrication techniques have been developed along with high integration and high performance of LSIs. The chemical mechanical polishing (hereinafter, also abbreviated as "CMP") method is one of them, and is a technique frequently used in the LSI manufacturing process, particularly in the multilayer wiring forming process.

This CMP method is also used for polishing the surface of a resin, and the CMP method is applied so that it is possible to obtain a resin product having few surface defects. As a result, various studies have been made as to polishing compositions for polishing various materials including resins.

JP 2016-183212 A discloses a polishing composition for polishing an object to be polished which contains a resin having high rigidity and high strength. More specifically, the Patent Literature discloses that even the resin having high rigidity and high strength can be polished at a high polishing rate by a polishing composition containing abrasive grains having a Mohs hardness and a surface acid amount equal to or more than a predetermined value and a dispersing medium. Further, from the viewpoint of the polishing rate, the Patent Literature also discloses that the abrasive grains preferably contain a-alumina as a main ingredient.

JP 2007-063442 A (US 2007/0044385 A) discloses a polishing composition for polishing an object to be polished made of a synthetic resin. More specifically, the Patent Literature discloses that a polishing composition containing a specific structure of polyurethane polymeric surfactant and having a predetermined viscosity range is used, whereby it is possible to suppress a decrease of the polishing composition and to suppress a reduction in polishing performance in polishing a synthetic resin. The Patent Literature also discloses that it is preferable that the polishing composition further contains α-alumina as abrasive grains, from the viewpoint of the polishing rate.

Further, it is known that inorganic particles such as alumina tend to aggregate in a liquid dispersing medium, and a technique for stably dispersing the inorganic particles has also been studied.

JP 2001-049031 A discloses that, in a dispersion composition comprising inorganic particles and a dispersing medium in liquid form, a specific cellulose is used as a dispersion stabilizer.

SUMMARY

Incidentally, the polishing composition is produced, distributed, stored, and the like in the form of a concentrated liquid, from the viewpoint of, for example, convenience and cost reduction, and it is diluted with a dispersing medium such as water, if necessary, and then used for polishing.

However, abrasive grains such as alumina are contained at a relatively high concentration in the concentrated liquid, so there is a problem that the abrasive grains tend to aggregate, even if the aggregated abrasive grains are stirred again, they cannot be sufficiently dispersed (the redispersibility is low). If the redispersibility is low, it becomes difficult to prepare a uniformly diluted polishing composition, and therefore improvement has been desired.

Therefore, an object of the present invention is to provide a unit capable of improving redispersibility in a concentrated liquid of a polishing composition containing alumina as abrasive grains.

The inventor has carried out a diligent study to solve the problem described above. As a result, the inventor has found that the redispersibility of the concentrated liquid is significantly improved by adding colloidal alumina having a specific aspect ratio in combination with a specific phosphorus-containing acid, and completed the present invention.

That is, the problem of the present invention can be solved by the following means.

A concentrated liquid of a polishing composition including particulate alumina; colloidal alumina having an aspect ratio of more than 5 and 800 or less; at least one phosphorus-containing acid selected from the group consisting of phosphoric acid, phosphoric acid condensates, organic phosphoric acids, phosphonic acid, and organic phosphonic acids; and water, wherein a pH of the concentrated liquid of the polishing composition is 2 or more and 4.5 or less.

DETAILED DESCRIPTION

Embodiments of the present invention are described hereinbelow. The present invention is not limited only to the following embodiments.

As used herein, the expression "X to Y" showing a range represents "X or more and Y or less". Unless otherwise indicated, operations and measurements of physical properties and the like are carried out under conditions of room temperature (in a range of 20° C. or more and 25° C. or less) and relative humidity of 40% RH or more and 50% RH or less.

<Concentrated Liquid of Polishing Composition>

One embodiment of the present invention relates to a concentrated liquid of a polishing composition including particulate alumina; colloidal alumina having an aspect ratio of more than 5 and 800 or less; at least one phosphorus-containing acid selected from the group consisting of phosphoric acid, phosphoric acid condensates (condensed phosphoric acids), organic phosphoric acids, phosphonic acids, and organic phosphonic acids; and water, wherein a pH of the concentrated liquid of the polishing composition is 2 or more and 4.5 or less. In the present specification, the term "concentrated liquid of a polishing composition" is also simply referred to as "concentrated liquid".

According to the present invention, it is possible to improve the redispersibility in the concentrated liquid of the polishing composition containing alumina as abrasive grains.

The inventor speculates the mechanism by which the above problem can be solved by the present invention as follows.

In the present invention, in order to improve the redispersibility of particulate alumina as abrasive grains, two kinds of ingredients are blended as dispersion stabilizers. A first dispersion stabilizer is colloidal alumina having an aspect ratio of more than and 800 or less. It is considered that colloidal alumina having an aspect ratio within the above range enters between the particles of the particulate alumina and acts as a spacer to suppress the aggregation of the particulate alumina. As a result, the redispersibility of the concentrated liquid can be improved. A second dispersion stabilizer is at least one phosphorus-containing acid selected from the group consisting of phosphoric acid, phosphoric acid condensates, organic phosphoric acids, phosphonic acids, and organic phosphonic acids. According to the study of the inventor, it has been found that the aggregation of alumina (particulate alumina and colloidal alumina) is remarkably suppressed by adjusting the pH to 2 or more and 4.5 or less using these phosphorus-containing acids. Meanwhile, it has also been confirmed that the aggregation inhibitory effect cannot be obtained when other acids are used. Further, as a result of further studies by the inventor, it has been found that alumina usually has a plus zeta potential in an acidic aqueous solution (in an aqueous solution whose pH is adjusted to 2 to 6 using other acids), but the zeta potential of alumina (particulate alumina and colloidal alumina) is modified (negatively shifted) to minus (−) in an acidic aqueous solution containing the above phosphorus-containing acid. Although the detailed mechanism is unknown, it is speculated that the zeta potential is modified (negatively shifted) to minus (−), causing electrostatic repulsion of alumina and suppressing aggregation. In particular, it is considered that the first dispersion stabilizer is used in combination with the second dispersion stabilizer, whereby electrostatic repulsion occurs between colloidal alumina that have entered between particulate alumina particles and particulate alumina, in addition to interparticle electrostatic repulsion of particulate alumina, and a remarkable aggregation inhibitory effect is exerted. Since colloidal alumina in the present invention has an aspect ratio of more than 5 and 800 or less, a surface area per unit volume is large and electrostatic repulsion can be effectively exerted. As a result, the redispersibility is remarkably improved in the concentrated liquid of the polishing composition containing alumina as abrasive grains.

Note that the above mechanism is based on speculation, and its correctness does not affect the technical scope of the present invention. Similarly, the correctness of other inferences in the present specification does not affect the technical scope of the present invention.

[Abrasive Grain]

The concentrated liquid according to the present invention contains particulate alumina as abrasive grains. Abrasive grains mechanically polish the object to be polished and improve the polishing rate. Since the particulate alumina has sufficient hardness, an effect of improving the polishing rate, particularly an effect of improving the polishing rate of various materials including resin, is high. As used herein, the term "particulate alumina" means alumina whose sphericity ((average minor axis/average major axis)×100) is 30% or more. The sphericity of the particulate alumina can be determined by the measurement method described in Examples to be described later.

The sphericity of the particulate alumina is not particularly limited, and is preferably 60% or less, more preferably 55% or less, and still more preferably 50% or less. When the sphericity of the particulate alumina is 60% or less, the friction during polishing becomes large, and a high polishing rate can be obtained.

An average particle size (average secondary particle size) of the particulate alumina is not particularly limited, and is preferably 0.01 μm or more, more preferably 0.1 μm or more, still more preferably 0.5 μm or more, and particularly preferably 1 μm or more. The average particle size is within the above range, the polishing rate is further improved. The average particle size of the particulate alumina is preferably 100 μm or less, more preferably 50 μm or less, still more preferably 20 μm or less, particularly preferably 10 μm or less, and most preferably 5 μm or less. The average particle size is within the above range, defects such as scratches on the object to be polished are further reduced. As a preferred example, the average particle size of the particulate alumina is 0.01 μm or more and 100 μm or less. The average particle size is more preferably 0.1 μm or more and 50 μm or less, still more preferably 0.5 μm or more and 20 μm or less, and yet still more preferably 0.5 μm or more and 10 μm, particularly preferably 0.5 μm or more and 5 μm or less, and most preferably 1 μm or more and 5 μm or less. The average particle size of the particulate alumina can be determined by the measurement method described in Examples to be described later.

The crystal form of the particulate alumina is not particularly limited, and is appropriately selected from α-alumina, γ-alumina, δ-alumina, θ-alumina, η-alumina, and κ-alumina. Among these crystal forms, from the viewpoint of further improving the polishing rate, it is preferable to use particulate alumina containing an α phase as a crystal phase (particulate alumina containing α-alumina), and it is more preferable to use particulate alumina containing an α phase as a main crystal phase (particulate alumina containing α-alumina as a main ingredient).

An α conversion rate of the particulate alumina is not particularly limited, and is preferably 50% or more, more preferably 60% or more, still more preferably 70% or more, and particularly preferably 75% or more (upper limit; 100%). The α conversion rate is within the above range, the polishing rate of a resin (e.g., epoxy resin) is further improved. This is considered because the a phase has a high hardness. The α conversion rate of the particulate alumina can be determined by the measurement method described in Examples to be described later.

Note that, the values of sphericity, average particle size, and a conversion rate are equal, even if particulate alumina as a raw material before preparing the concentrated liquid is measured, or particulate alumina extracted from the prepared concentrated liquid is measured.

A concentration (content) of the particulate alumina is not particularly limited, and is preferably 2% by mass or more, more preferably 5% by mass or more, still more preferably 10% by mass or more, and particularly preferably 15% by mass or more relative to the total mass of the concentrated liquid. The content of the alumina particles is preferably 40% by mass or less, more preferably 35% by mass or less, still more preferably 30% by mass or less, and particularly preferably 25% by mass or less relative to the total mass of the concentrated liquid. A preferable example of the concentration of the particulate alumina is 2% by mass or more and 40% by mass or less, more preferably 5% by mass or more and 35% by mass or less, still more preferably 10% by mass or more and 30% by mass or less, and particularly preferably 15% by mass or more and 25% by mass or less. When the concentration of the particulate alumina is within the above range, the effect of improving the redispersibility of the concentrated liquid, which is the effect of the present invention, is more remarkably exerted.

The particulate alumina can be easily produced by appropriately referring to a known production method. Further, as the particulate alumina, a commercially available product may be used.

Note that only one type of particulate alumina may be used singly, or two or more types of particulate alumina may be used in combination.

[First Dispersion Stabilizer]

The concentrated liquid according to the present invention contains colloidal alumina as the first dispersion stabilizer. Generally, the term "colloidal alumina" refers to a dispersion liquid in which alumina fine particles are colloidally dispersed in water as a dispersing medium, but particularly refers to only the above-described alumina fine particles in the present specification. That is, the physical properties and content of colloidal alumina described below are actually interpreted as the physical properties and content of alumina fine particles. Alumina fine particles contained in colloidal alumina are extremely small and difficult to handle as powder, so that the particles are used as colloidal alumina dispersed in water. In the present specification, from the viewpoint of distinguishing between the particulate alumina as abrasive grains and the alumina fine particles contained in colloidal alumina, the latter is intentionally referred to as "colloidal alumina".

In the present invention, it is essential that the colloidal alumina has an aspect ratio of more than 5 and 800 or less. When the aspect ratio is 5 or less, sufficient redispersibility may not be obtained. This is considered because the function as the spacer and the electrostatic repulsion do not act sufficiently as described above. Further, when the aspect ratio is more than 800, the colloidal alumina adversely affects the polishing performance, and there is a possibility that a sufficient polishing rate cannot be obtained. The aspect ratio is preferably 10 or more and 750 or less, more preferably 50 or more and 500 or less, and still more preferably 100 or more and 300 or less.

The average major axis of colloidal alumina is not particularly limited, and is preferably 50 nm or more and 5000 nm or less, more preferably 70 nm or more and 2000 nm or less, and still more preferably 100 nm or more and 1000 nm or less. When the average major axis is within the above range, it is considered that the distance between the particles of the particulate alumina can be appropriately maintained. The average minor axis of colloidal alumina is not particularly limited, and is preferably 0.1 nm or more and 10 nm or less, more preferably 0.2 nm or more and 5 nm or less, and still more preferably 0.5 nm or more and 2 nm or less. It is considered that when the average minor axis is within the above range, the colloidal alumina easily enters between the particles of the particulate alumina.

The ratio of the average particle size of particulate alumina to the average major axis of colloidal alumina (average particle size of particulate alumina/average major axis of colloidal alumina) is preferably 0.5 or more and 50 or less, more preferably 5 or more and 40 or less, and still more preferably 10 or more and 30 or less. When the ratio is within the above range, the colloidal alumina easily enters between the particles of the particulate alumina and the distance between the particles of the particulate alumina can be appropriately maintained. Accordingly, it is considered that the aggregation of the particulate alumina is further suppressed. As a result, the redispersibility of the concentrated liquid can be further improved.

The shape of colloidal alumina is not particularly limited as long as the colloidal alumina has the above aspect ratio. The shape may be rod-like, needle-like, fibrous, or feathery. Among these shapes, the fibrous and feathery shapes are preferable, and the feathery shape is more preferable, from the viewpoint of further exerting the effect of the present invention. As used herein, the term "fibrous" means that the aspect ratio is 50 or more. Further, as used herein, the term "feathery" means a state in which 10 or more fibrous colloidal alumina fibers gather to form an aggregate, in an image obtained by measuring the colloidal alumina with a scanning electron microscope (SEM) (product name: SU8000, manufactured by Hitachi High-Tech Corporation.).

Note that the aspect ratio, average major axis, average minor axis, and shape are equal, even if colloidal alumina as a raw material before preparing the concentrated liquid is measured, or colloidal alumina extracted from the concentrated liquid prepared is measured.

A concentration (content) of the colloidal alumina is not particularly limited, and is preferably 0.01% by mass or more, more preferably 0.1% by mass or more, still more preferably 1% by mass or more, and particularly preferably 3% by mass or more relative to the total mass of the concentrated liquid. When the concentration is within the above range, the effect of improving the redispersibility of the concentrated liquid, which is the effect of the present invention, is more remarkably exerted. The concentration of the colloidal alumina is preferably 20% by mass or less, more preferably 15% by mass or less, still more preferably 10% by mass or less, and particularly preferably 5% by mass or less relative to the total mass of the concentrated liquid. When the concentration is within the above range, a high polishing rate can be exerted without impairing the polishing performance of the abrasive grains. A preferable example of the concentration of the colloidal alumina is 0.01% by mass or more and 20% by mass or less, more preferably 0.1% by mass or more and 15% by mass or less, still more preferably 1% by mass or more and 10% by mass or less, and particularly preferably 3% by mass or more and 5% by mass or less.

The content of the colloidal alumina relative to 100 parts by mass of the content of the particulate alumina is not particularly limited, and is preferably 0.1 parts by mass or more and 70 parts by mass or less, more preferably 0.5 parts by mass or more and 50 parts by mass or less, more preferably 1 part by mass or more and 40 parts by mass or less, and particularly preferably 10 parts by mass or more and 30 parts by mass or less. When the content is within the above range, it is possible to achieve both an improvement in the redispersibility of the concentrated liquid and a sufficient polishing rate.

The colloidal alumina can be easily produced by appropriately referring to a known production method (e.g., JP 7-291621 A). Further, as the colloidal alumina, commercially available products as described in Examples to be described later may be used.

Note that only one type of colloidal alumina may be used singly, or two or more types of colloidal alumina may be used in combination.

[Second Dispersion Stabilizer]

The concentrated liquid according to the present invention contains, as a second dispersion stabilizer, at least one phosphorus-containing acid selected from the group consisting of phosphoric acid, phosphoric acid condensates, organic phosphoric acids, phosphonic acids, and organic phosphonic acids. As used herein, the term "organic phosphoric acids" refers to an organic compound having at least one phosphate group ($—OP(=O)(OH)_2$), and the term "organic phosphonic acids" refers to an organic compound having at least one phosphonic acid group ($—P(=O)(OH)$ 2). Further, as used herein, the "phosphoric acid, phosphoric acid condensates, and organic phosphoric acids" are also simply referred to as "phosphoric acid-based acids", and the "phosphonic acids and organic phosphonic acids" are also simply referred to as "phosphonic acid-based acids". These phosphorus-containing acids have a function of modifying (negatively shifting) the zeta potential of alumina (particulate alumina and colloidal alumina) to minus (−). Then, alumina particles whose zeta potential has become minus (−) repel each other electrostatically, so that aggregation can be suppressed and the redispersibility of the concentrated liquid can be improved.

Specific examples of phosphorus-containing acids include, phosphoric acid (orthophosphoric acid), pyrophosphoric acid, tripolyphosphoric acid, tetrapolyphosphoric acid, hexametaphosphoric acid, methyl acid phosphate, ethyl acid phosphate, ethylene glycol acid phosphate, isopropyl acid phosphate, phytic acid (myo-inositol-1,2,3,4,5,6-hexaphosphate), 1-hydroxyethylidene-1, 1-diphosphonic acid (HEDP), nitrilotris(methylenephosphonic acid) (NTMP), ethylenediaminetetra(methylenephosophonic acid) (EDTMP), diethylenetriamine penta(methylenephosphonic acid), ethane-1,1-diphosphonic acid, ethane-1,1,2-triphosphonic acid, ethane-1-hydroxy-1,1-diphosphonic acid, ethane hydroxy-1,1,2-triphosphonic acid, ethane-1,2-dicarboxy-1,2-diphosphonic acid, methanehydroxyphosphonic acid, and the like. Among these phosphorus-containing acids, phosphonic acid-based acids are preferable, organic phosphonic acids are more preferable, and 1-hydroxyethylidene-1,1-diphosphonic acid (HEDP), nitrilotris (methylenephosphonic acid) (NTMP), and ethylenediaminetetra(methylenephosophonic acid) (EDTMP) are still more preferable, from the viewpoint of improving the redispersibility and the balance between polishing rate and etching rate.

Note that only one type of phosphorus-containing acid may be used singly, or two or more types of phosphorus-containing acids may be used in combination.

The amount of phosphorus-containing acid contained in the concentrated liquid is not particularly limited. According to a preferred example, the concentrated liquid according to the present invention contains no acid other than the phosphorus-containing acid. In this case, the amount of phosphorus-containing acid contained in the concentrated liquid is such that the pH of the concentrated liquid is 2 or more and 4.5 or less.

[Dispersing Medium]

The concentrated liquid according to the present invention contains water as a dispersing medium. The dispersing medium disperses or dissolves each ingredient.

From the viewpoint of preventing the influence of impurities on other ingredients of the polishing composition, it is preferable to use water having the highest possible purity. Specifically, pure water, ultrapure water, or distilled water, from which impurity ions have been removed with an ion exchange resin and then foreign substances have been removed through a filter, is preferable.

Further, as the dispersing medium, an organic solvent or the like may be further contained for the purpose of controlling, for example, the dispersibility of other ingredients of the polishing composition.

[pH]

The concentrated liquid according to this embodiment is characterized in that the pH is 2 or more and 4.5 or less. When the pH is less than 2, the elution of metals such as copper is promoted, and the etching rate may become too high. Further, when the pH is more than 4.5, sufficient redispersibility may not be obtained. This is considered because the zeta potential of alumina due to the phosphorus-containing acid is not sufficiently modified (not negatively shifted). The pH is preferably more than 2 and less than 4.0, and more preferably 2.2 or more and 3 or less. The pH of the concentrated liquid is determined by the measurement method described in Examples to be described later.

[Electrical Conductivity (EC)]

The concentrated liquid according to this embodiment preferably has a specific range of electrical conductivity in order to further improve the redispersibility. Specifically, the electrical conductivity of the concentrated liquid is preferably 1.5 mS/cm or more and 3.0 mS/cm or less, more preferably 1.7 mS/cm or more and 2.5 mS/cm or less, and still more preferably 2.0 mS/cm or more and 2.3 mS/cm or less. When the electrical conductivity is 1.5 mS/cm or more, a sufficient amount of phosphorus-containing acid-derived anions are present in the concentrated liquid. Thus, the zeta potential of alumina can be sufficiently modified (negatively shifted), and the redispersibility can be further improved. When the electrical conductivity is 3.0 mS/cm or less, the amount of ions other than phosphorus-containing acid-derived anions (hereinafter referred to as "other ions") in the concentrated liquid is low. According to the study of the inventor, the presence of other ions (particularly cations such as $Na^+$ and $K^+$) is considered to act in a direction that hinders the modification (negative shifting) of the zeta potential of alumina. Accordingly, the amount of other ions (particularly cations such as $Na^+$ and $K^+$) is reduced, as a result of which the redispersibility can be further improved. The electrical conductivity of the concentrated liquid is determined by the measurement method described in Examples to be described later.

[Other Ingredients]

The concentrated liquid may contain abrasive grains other than the above, and known ingredients such as pH adjusting agents, chelating agents, thickeners, oxidizing agents, dispersants, surface protectants, wetting agents, surfactants, antirust agents, antiseptic agents, and antifungal agents, as long as the effect of the present invention is not impaired. The content of other ingredients may be appropriately set according to the purpose of addition.

[Production Method of Concentrated Liquid of Polishing Composition]

The production method (preparation method) of the concentrated liquid of the polishing composition is not particularly limited, and for example, a production method including stirring and mixing particulate alumina, colloidal alumina, a phosphorus-containing acid, and water may be used as appropriate. In the production method, other ingredients may be further stirred and mixed.

The temperature at which respective ingredients are mixed is not particularly limited, and is preferably 10 to 40° C., and heating may be performed to increase the rate of dissolution. Further, the mixing time is not particularly limited.

[Polishing Composition]

The concentrated liquid of the polishing composition according to the present invention may be diluted and used as a polishing solution, or may be used as it is as a polishing solution.

According to another embodiment of the present invention, there is provided a polishing composition obtained by 2 to 20-fold dilution of the concentrated liquid of the polishing composition described above on a mass basis using a dispersing medium. In other words, the polishing composition contains 1 part by mass of the concentrated liquid of the polishing composition described above and 1 to 19 parts by mass of the dispersing medium.

[Dispersing Medium]

The dispersing medium is not particularly limited, and a similar dispersing medium to the dispersing medium contained in the concentrated liquid described above can be used, and water is preferably contained. Further, from the viewpoint of preventing the influence of impurities on other ingredients of the polishing composition, it is preferable to use water having the highest possible purity. Specifically, pure water, ultrapure water, or distilled water, from which impurity ions have been removed with an ion exchange resin and then foreign substances have been removed through a filter, is preferable. Further, as the dispersing medium, an organic solvent or the like may be further contained for the purpose of controlling, for example, the dispersibility of other ingredients of the polishing composition.

The production method of the polishing composition (preparation method) is not particularly limited, and for example, a production method including stirring and mixing the concentrated liquid of the polishing composition and the dispersing medium may be used as appropriate.

The temperature at the time of mixing is not particularly limited, and is preferably 10 to 40° C. Further, the mixing time is not particularly limited.

[Object to be Polished]

The object to be polished by using the polishing composition according to the present invention is not particularly limited, and any object to be polished in a known CMP step can be appropriately selected.

Si element-containing materials are not particularly limited, and examples thereof include polysilicon, amorphous silicon, single-crystal silicon, n-type doped single-crystal silicon, p-type doped single-crystal silicon, Si-based alloys such as SiGe, silicon oxide ($SiO_2$), BD (black diamond: SiOCH), FSG (fluorosilicate glass), HSQ (hydrogen silsesquioxane), CYCLOTENE, SiLK, MSQ (Methylsilsesquioxane), silicon nitride (SiN), silicon carbonitride (SiCN), and the like. Here, the silicon oxide is preferably silicon oxide derived from tetraethyl orthosilicate (TEOS).

The resin is not particularly limited, and examples thereof include acrylic resins such as poly(methyl (meth)acrylate), methyl methacrylate-methyl acrylate copolymer, and urethane(meth)acrylate resin; epoxy resins; olefin resins such as ultra-high molecular weight polyethylene (UHPE); phenol resin; polyamide resin (PA); polyimide resin (PI); polyester resins such as polyethylene terephthalate (PET), polybutylene terephthalate (PBT), unsaturated polyester resins; polycarbonate resins (PC); polystyrene resins such as syndiotactic polystyrene (SPS); polynorbornene resins; polybenzbenzoxazole (PBO); polyacetal (POM); modified polyphenylene ether (m-PPE); amorphous polyarylate (PAR); polysulfone (PSF); polyether sulfone (PES); polyphenylene sulfide (PPS); polyetheretherketone (PEEK); polyether imide (PEI); fluororesin; liquid crystal polymer (LCP), and the like. Note that, as used herein, the term "(meth) acrylic acid" refers to acrylic acid or methacrylic acid, and both acrylic acid and methacrylic acid. Similarly, as used herein, the term "(meth) acrylate" refers to acrylate or methacrylate, and both acrylate and methacrylate.

Further, the resin also includes reinforced plastics in which fibers such as glass fiber and carbon fiber are compounded to improve the strength.

Among them, the object to be polished is preferably an object to be polished containing a Si element-containing material or a resin on a polishing surface, and more preferably an object to be polished containing silicon oxide or a resin on a polishing surface. Further, the object to be polished is still more preferably an object to be polished containing a resin on a polishing surface, particularly preferably an object to be polished containing an epoxy resin, a polyimide resin or an acrylic resin on a polishing surface, and most preferably an object to be polished containing an epoxy resin on a polishing surface. When used for polishing an object to be polished containing a resin on a polishing surface, particularly when used for polishing an object to be polished containing an epoxy resin on a polished surface, the polishing rate is improved.

In addition, in the object to be polished containing a resin on a polishing surface, the resin may further include inorganic fillers such as calcium carbonate, magnesium carbonate, barium sulfate, magnesium sulfate, aluminum silicate, titanium oxide, alumina, zinc oxide, silicon dioxide, kaolin, talc, glass beads, sericite activated white earth, bentonite, and aluminum nitride, and organic fillers such as polyester fine particles, polyurethane fine particles, and rubber fine particles, and the like.

These Si element-containing materials or resins can be used singly, or in combination of two or more kinds thereof.

Further, the object to be polished may be an object to be polished containing a material different from the Si element-containing materials or resins on a polishing surface, in addition to the Si element-containing materials or resins. Examples of such materials include copper (Cu), aluminum (Al), tantalum (Ta), tantalum nitride (TaN), titanium (Ti), titanium nitride (TiN), nickel (Ni), ruthenium (Ru), cobalt (Co), tungsten (W), tungsten nitride (WN), and the like. When used for polishing an object to be polished containing these metal materials on a polishing surface, particularly when used for polishing an object to be polished containing copper (Cu) on a polishing surface, it is possible to keep the etching rate low.

[Polishing Method]

Another embodiment of the present invention relates to a polishing method including polishing an object to be polished using the above concentrated liquid or the above polishing composition. Preferred examples of the object to be polished according to this embodiment are similar to those exemplified in the above description of the polishing composition. For example, it is preferable to polish an object to be polished containing a resin and a metal on a polishing surface. That is, a preferred embodiment of the polishing method according to the present invention includes polishing an object to be polished containing a resin and a metal using the above concentrated liquid or the above polishing composition.

When polishing an object to be polished using the polishing composition, the polishing can be performed using a device and conditions used for normal polishing. Examples of general polishing machines include a single-sided polishing machine and a double-sided polishing machine. In the single-sided polishing machine, generally, a holder called "carrier" is used to hold an object to be polished, and while the polishing composition is supplied from above, a surface plate having a polishing pad is pressed against one side of the object to be polished and the surface plate is rotated, as a result of which one side of the object to be polished is polished. In the double-sided polishing machine, generally, a holder called "carrier" is used to hold an object to be polished, and while the polishing composition is supplied from above, a surface plate having a polishing pad is pressed against opposite surfaces of the object to be polished and they are rotated in opposite directions, as a result of which both sides of the object to be polished are polished. At this time, polishing is performed by the physical action of friction between the polishing pad and the polishing composition and the object to be polished, and the chemical action which is given to the object to be polished by the polishing composition. As the polishing pad, a porous material such as non-woven fabric, polyurethane, or suede can be used without particular limitation. Preferably, the polishing pad is processed to cause the polishing composition (polishing solution) to accumulate.

Examples of polishing conditions include a polishing load, a surface plate rotation speed, a carrier rotation speed, a flow rate of the polishing composition, a polishing time, and the like. These polishing conditions are not particularly limited, and for example, the polishing load is preferably 0.1 psi (0.69 kPa) or more and 10 psi (69 kPa) or less, more preferably 0.5 psi (3.5 kPa) or more and 8.0 psi (55 kPa) or less, and still more preferably 1.0 psi (6.9 kPa) or more and 6.0 psi (41 kPa) or less, per unit area of the object to be polished. Generally, the higher the load, the higher the frictional force due to the abrasive grains, and the mechanical processing force is improved, whereby the polishing rate is increased. When the polishing load is within this range, a sufficient polishing rate is exerted, and it is possible to suppress damage to the object to be polished due to a load and defects such as scratches on the surface. The surface plate rotation speed and the carrier rotation speed are preferably in a range of 10 rpm (0.17 s$^{-1}$) to 500 rpm (8.3 s$^{-1}$). The supply amount of the polishing composition may be any supply amount (flow rate) that covers the entire object to be polished, and may be adjusted according to conditions such as the size of the object to be polished. The method of supplying the polishing composition to the polishing pad is also not particularly limited, and for example, a method of continuously supplying the polishing composition with a pump or the like may be used. Further, the processing time is not particularly limited as long as the desired processing result can be obtained, and the processing time is preferably set to a shorter time due to the high polishing rate.

Further, another aspect of the present invention relates to a method of producing an object to be polished, including polishing the object to be polished by the polishing method described above. Preferred examples of the object to be polished according to this embodiment are similar to those exemplified in the above description of the polishing composition. A preferred example includes a method of manufacturing an electronic circuit board, including polishing an object to be polished containing a resin and a metal by the polishing method.

EXAMPLES

The present invention is described in more detail with reference to the following Examples and Comparative Examples. However, the technical scope of the present invention is not limited to the following Examples. Note that, unless otherwise indicated, "%" and "parts" refer to "% by mass" and "parts by mass", respectively.

<Measurement Method of Physical Properties>

[α Conversion Rate]

The α conversion rate [%] of particulate alumina (abrasive grains) was calculated according to the following formula, based on the peak height (I25.6) of the α phase (012) plane appeared at a position of 2θ=25.6° and the peak height (I46) of the γ phase appeared at a position of 2θ=46° in the powder X-ray diffraction spectra obtained by using a powder X-ray diffractometer.

$$\alpha \text{ conversion rate} = I25.6/(I25.6 + I46) \times 100 \text{ [unit: \%]} \quad \text{[Equation 1]}$$

[Sphericity]

For particulate alumina (abrasive grains), 100 particles were randomly selected from an image measured with a scanning electron microscope (SEM) (product name: SU8000, manufactured by Hitachi High-Tech Corporation.). The major axis and minor axis of each of the abrasive grains were measured, and the average major axis and the average minor axis were calculated. Subsequently, the sphericity was calculated according to the following formula using the obtained values of the average major axis and the average minor axis.

$$\text{Sphericity [\%]} = (\text{Average minor axis [µm]}/\text{Average major axis [µm]}) \times 100 \quad \text{[Equation 2]}$$

[Average Particle Size]

Particulate alumina (abrasive grains) was measured using a particle size distribution measuring device (Microtrac MT3000II, manufactured by MicrotracBEL Corp.), and the average particle size (average secondary particle size) was evaluated.

[Average Major Axis, Average Minor Axis, and Aspect Ratio]

For colloidal alumina (first dispersion stabilizer), 100 samples were randomly selected from an image measured with a scanning electron microscope (SEM) (product name: SU8000, manufactured by Hitachi High-Tech Corporation.). The major axis and minor axis of each of the samples were measured, and the average major axis and the average minor axis were calculated. Subsequently, the aspect ratio of colloidal alumina was calculated according to the following formula using the obtained values of the average major axis and the average minor axis.

$$\text{Aspect ratio} = \text{Average major axis [µm]}/\text{Average minor axis [µm]} \quad \text{[Equation 3]}$$

[pH]

The pH value of the concentrated liquid (liquid temperature: 25° C.) of the polishing composition was confirmed by a pH meter (HORIBA, Ltd. model number: LAQUA (registered trademark)).

[Electrical Conductivity (EC)]

The electrical conductivity of the concentrated liquid (liquid temperature: 25° C.) of the polishing composition was measured with a desktop electric conductivity meter (manufactured by HORIBA, Ltd. model number: DS-71).

<Preparation of Concentrated Liquid of Polishing Composition>

Examples 1 to 20 and Comparative Examples 1 to 12

The abrasive grains, the first dispersion stabilizer, and the second dispersion stabilizer shown in shown in Table 1 as well as water were stirred and mixed to obtain a concentrated liquid of a polishing composition (mixing temperature: about 25° C., mixing time: about 10 minutes). At this time, the additive amount of the second dispersion stabilizer was set so that the pH of the concentrated liquid became each value shown in Table 1.

Note that the following commercially available products were used as the first dispersion stabilizer.

B1: ALUMINASOL 200 (manufactured by Nissan Chemical Corporation);

B2: Alumisol-F1000 (manufactured by Kawaken Fine Chemicals Co., Ltd.);

B3: Alumisol-F3000 (manufactured by Kawaken Fine Chemicals Co., Ltd.);

B4: ALUMINASOL 520A (manufactured by Nissan Chemical Corporation);

B5: Alumisol-10A (manufactured by Kawaken Fine Chemicals Co., Ltd.);

B6: Alumisol-10C (manufactured by Kawaken Fine Chemicals Co., Ltd.);

B7: CEOLUS (registered trademark) RC591 (manufactured by Asahi Kasei Corporation); and B8: Poly Aluminum Chloride 300A (manufactured by Taki Chemical Co., Ltd.).

<Evaluation>

[Redispersibility]

First, the concentrated liquid of the polishing composition was sufficiently stirred, and the specific gravity of the concentrated liquid in a state where the abrasive grains were uniformly dispersed was measured. The value of specific gravity at this time is defined as X. Next, the concentrated liquid was centrifuged (at 500 rpm for 30 minutes) to precipitate the abrasive grains. Shaking (70 spm (stroke per minute)) was performed using a vertical shaker (KM Shaker; manufactured by IWAKI CO., LTD.) in a state in which the container containing the concentrated liquid after centrifugation was turned upside down, and the specific gravity of the liquid on the top of the container was measured every 30 minutes. Then, the time from the start of shaking until the value of specific gravity returned to X was calculated and evaluated according to the following criteria.

<Evaluation Criteria>

⊙ (Excellent): Within 30 minutes

○ (Good): Within 60 minutes

Δ (Satisfactory): Within 90 minutes x (Poor): 120 minutes or more.

[Polishing Rate]

Epoxy resin (manufactured by Standard Test Piece Inc., specific gravity: 1.11) was prepared as the object to be polished. Subsequently, the concentrated liquid of the polishing composition was diluted 10-fold with water on a mass basis to prepare a polishing composition. The substrate was polished by the following polishing machine under polishing conditions using the obtained polishing composition, and the polishing rate of the epoxy resin was evaluated according to the following method.

(Polishing Machine and Polishing Conditions)

Polishing machine: small desktop polishing machine (EJ380IN, manufactured by Engis Japan Corporation);

Polishing pad: hard polyurethane pad (IC1000, manufactured by NITTA DuPont Incorporated.);

Platen (plate) rotation speed: 70 [rpm];

Head (carrier) rotation speed: 70 [rpm];

Polishing pressure: 4.0 [psi];

Flow rate of polishing composition: 100 [ml/min]; and

Polishing time: 1 [min].

(Method of Evaluating Polishing Rate)

1. The mass of the object to be polished before and after polishing was measured using the electronic balance GH-202 (manufactured by A&D Company, Limited), and the amount of change in mass ΔM [kg] of the object to be polished before and after polishing was calculated from differences in the mass;

2. The amount of change in volume of the object to be polished ΔV [m$^3$] was calculated by dividing the amount of change in mass of the object to be polished before and after polishing AM [kg] by the specific gravity of the object to be polished (specific gravity of the material to be polished);

3. The amount of change in thickness Δd [m] of the object to be polished before and after polishing can be calculated by dividing the amount of change in volume ΔV [m$^3$] of the object to be polished by the area S [m$^2$] of the polishing surface of the object to be polished; and 4. The amount of change in thickness Δd [m] of the object to be polished before and after polishing was divided by the polishing time t [min], and the unit was further converted to [μm/min]. This value was defined as the polishing rate v [μm/min].

[Etching Rate]

The concentrated liquid of the polishing composition was diluted 10-fold with water on a mass basis to prepare a polishing composition. Subsequently, a copper (Cu)-containing material (size: 32 mm×32 mm×1 mm) was immersed in the polishing composition under the following conditions, and the etching rate was determined from the mass reduction rate before and after the immersion using specific the gravity of copper (8.96). The lower the etching rate, the higher the effect of suppressing copper elution, which is preferable. Note that 1 Å=0.1 nm.

(Etching Conditions)

Slurry amount: 500 mL

Stirring speed: 500 rpm

Etching time: 5 minutes

Slurry temperature: 43° C.

The results are shown in Table 1.

TABLE 1

| | Abrasive grains | | | | First dispersion stabilizer | | | | | | |
|---|---|---|---|---|---|---|---|---|---|---|---|
| | Kind | α conversion rate (%) | Average particle size (μm) <A> | Concentration (% by mass) | Sphericity (%) | Kind | | Average major axis (nm) <B> | Average minor axis (nm) | Aspect ratio | Shape | Concentration (% by mass) |
| Example 1 | Particulate alumina | 78 | 2.8 | 20 | 20 | Colloidal alumina | B1 | 125 | 0.8 | 156 | Feathery | 5.0 |
| Example 2 | Particulate alumina | 78 | 2.8 | 20 | 20 | Colloidal alumina | B1 | 125 | 0.8 | 156 | Feathery | 5.0 |
| Example 3 | Particulate alumina | 78 | 2.8 | 20 | 20 | Colloidal alumina | B1 | 125 | 0.8 | 156 | Feathery | 5.0 |
| Example 4 | Particulate alumina | 78 | 2.8 | 20 | 20 | Colloidal alumina | B1 | 125 | 0.8 | 156 | Feathery | 5.0 |
| Example 5 | Particulate alumina | 78 | 2.8 | 20 | 20 | Colloidal alumina | B1 | 125 | 0.8 | 156 | Feathery | 5.0 |
| Example 6 | Particulate alumina | 78 | 2.8 | 20 | 20 | Colloidal alumina | B1 | 125 | 0.8 | 156 | Feathery | 5.0 |
| Example 7 | Particulate alumina | 78 | 2.8 | 20 | 20 | Colloidal alumina | B2 | 1400 | 4 | 350 | Feathery | 5.0 |

TABLE 1-continued

| | | | | | | | | | | | | |
|---|---|---|---|---|---|---|---|---|---|---|---|---|
| Example 8 | Particulate alumina | 78 | 2.8 | 20 | 20 | Colloidal alumina | B3 | 3000 | 4 | 750 | Feathery | 5.0 |
| Example 9 | Particulate alumina | 78 | 2.8 | 20 | 20 | Colloidal alumina | B1 | 125 | 0.8 | 156 | Feathery | 5.0 |
| Example 10 | Particulate alumina | 78 | 2.8 | 20 | 20 | Colloidal alumina | B1 | 125 | 0.8 | 156 | Feathery | 5.0 |
| Example 11 | Particulate alumina | 78 | 2.8 | 20 | 20 | Colloidal alumina | B1 | 125 | 0.8 | 156 | Feathery | 5.0 |
| Example 12 | Particulate alumina | 78 | 1.5 | 20 | 20 | Colloidal alumina | B1 | 125 | 0.8 | 156 | Feathery | 5.0 |
| Example 13 | Particulate alumina | 78 | 0.8 | 20 | 20 | Colloidal alumina | B1 | 125 | 0.8 | 156 | Feathery | 5.0 |
| Example 14 | Particulate alumina | 22 | 0.5 | 20 | 20 | Colloidal alumina | B1 | 125 | 0.8 | 156 | Feathery | 5.0 |
| Example 15 | Particulate alumina | 78 | 2.8 | 20 | 20 | Colloidal alumina | B1 | 125 | 0.8 | 156 | Feathery | 10.0 |
| Example 16 | Particulate alumina | 78 | 2.8 | 20 | 20 | Colloidal alumina | B1 | 125 | 0.8 | 156 | Feathery | 3.0 |
| Example 17 | Particulate alumina | 78 | 2.8 | 20 | 20 | Colloidal alumina | B1 | 125 | 0.8 | 156 | Feathery | 1.0 |
| Example 18 | Particulate alumina | 78 | 2.8 | 20 | 20 | Colloidal alumina | B1 | 125 | 0.8 | 156 | Feathery | 0.5 |
| Example 19 | Particulate alumina | 78 | 2.8 | 20 | 20 | Colloidal alumina | B1 | 125 | 0.8 | 156 | Feathery | 0.1 |
| Comparative Example 1 | Particulate alumina | 78 | 2.8 | 20 | 20 | Colloidal alumina | B1 | 125 | 0.8 | 156 | Feathery | 5.0 |
| Comparative Example 2 | Particulate alumina | 78 | 2.8 | 20 | 20 | Colloidal alumina | B1 | 125 | 0.8 | 156 | Feathery | 5.0 |
| Comparative Example 3 | Particulate alumina | 78 | 2.8 | 20 | 20 | Colloidal alumina | B1 | 125 | 0.8 | 156 | Feathery | 5.0 |
| Comparative Example 4 | Particulate alumina | 78 | 2.8 | 20 | 20 | Colloidal alumina | — | — | — | — | | — |
| Comparative Example 5 | Particulate alumina | 78 | 2.8 | 20 | 20 | Colloidal alumina | — | — | — | — | | — |
| Comparative Example 6 | Particulate alumina | 78 | 2.8 | 20 | 20 | Colloidal alumina | — | — | — | — | | — |
| Comparative Example 7 | Particulate alumina | 78 | 2.8 | 20 | 20 | Colloidal alumina | — | — | — | — | | — |
| Comparative Example 8 | Particulate alumina | 78 | 2.8 | 20 | 20 | Colloidal alumina | B4 | 20 | 10 | 2 | Rod-like | 5.0 |
| Comparative Example 9 | Particulate alumina | 78 | 2.8 | 20 | 20 | Colloidal alumina | B5 | 50 | 10 | 5 | Rod-like | 5.0 |
| Comparative Example 10 | Particulate alumina | 78 | 2.8 | 20 | 20 | Colloidal alumina | B6 | 800 | 800 | 1 | Particulate | 5.0 |
| Comparative Example 11 | Particulate alumina | 78 | 2.8 | 20 | 20 | Crystalline cellulose | B7 | — | — | — | | 5.0 |
| Comparative Example 12 | Particulate alumina | 78 | 2.8 | 20 | 20 | Poly Aluminum Chloride | B8 | — | — | — | | 5.0 |

TABLE 1-continued

| | Second dispersion stabilizer Kind | A/B | Physical properties pH (−) | Physical properties EC (mS/cm) | Evaluation Polishing rate [Epoxy] (μm/min) | Evaluation Etching rate [Cu] (Å/min) | Redispersibility |
|---|---|---|---|---|---|---|---|
| Example 1 | HEDP | 22.4 | 2.4 | 2.0 | 5.3 | 11 | ◎ |
| Example 2 | Phosphoric acid | 22.4 | 2.4 | 2.1 | 5.3 | 12 | ○ |
| Example 3 | Polyphosphoric acid | 22.4 | 2.4 | 2.2 | 5.2 | 13 | ◎ |
| Example 4 | Phytic acid | 22.4 | 2.4 | 2.3 | 5.1 | 18 | ◎ |
| Example 5 | NTMP | 22.4 | 2.4 | 2.0 | 5.3 | 11 | ◎ |
| Example 6 | EDTMP | 22.4 | 2.4 | 2.1 | 5.3 | 12 | ◎ |
| Example 7 | HEDP | 2.0 | 2.4 | 2.2 | 4.9 | 12 | ◎ |
| Example 8 | HEDP | 0.9 | 2.4 | 2.3 | 2.8 | 14 | ◎ |
| Example 9 | HEDP | 22.4 | 2.0 | 2.7 | 5.4 | 21 | ◎ |
| Example 10 | HEDP | 22.4 | 4.0 | 1.8 | 4.9 | 10 | ○ |
| Example 11 | HEDP | 22.4 | 4.5 | 1.7 | 4.8 | 10 | Δ |
| Example 12 | HEDP | 12.0 | 2.4 | 2.3 | 4.0 | 13 | ◎ |
| Example 13 | HEDP | 6.4 | 2.4 | 2.2 | 2.9 | 14 | ◎ |
| Example 14 | HEDP | 4.0 | 2.4 | 2.3 | 1.2 | 14 | ◎ |
| Example 15 | HEDP | 22.4 | 2.4 | 2.5 | 5.3 | 17 | ◎ |
| Example 16 | HEDP | 22.4 | 2.4 | 2.0 | 5.2 | 11 | ◎ |
| Example 17 | HEDP | 22.4 | 2.4 | 1.9 | 5.1 | 11 | ◎ |
| Example 18 | HEDP | 22.4 | 2.4 | 1.8 | 5.2 | 9 | ○ |
| Example 19 | HEDP | 22.4 | 2.4 | 1.7 | 5.3 | 9 | Δ |
| Comparative Example 1 | Nitric acid | 22.4 | 2.4 | 2.2 | 5.1 | 11 | X |
| Comparative Example 2 | Maleic acid | 22.4 | 2.4 | 2.1 | 5.2 | 10 | X |
| Comparative Example 3 | None | 22.4 | 4.9 | 1.5 | 5.2 | 7 | X |
| Comparative Example 4 | HEDP | — | 2.4 | 1.6 | 5.1 | 8 | X |
| Comparative Example 5 | Nitric acid | — | 2.4 | 1.5 | 5.1 | 8 | X |
| Comparative Example 6 | Maleic acid | — | 2.4 | 1.6 | 5.0 | 9 | X |
| Comparative Example 7 | Citric acid | — | 2.4 | 1.7 | 5.0 | 9 | X |
| Comparative Example 8 | HEDP | 140.0 | 2.4 | 2.2 | 5.1 | 13 | X |

TABLE 1-continued

| | | | | | | | |
|---|---|---|---|---|---|---|---|
| Comparative Example 9 | | HEDP | 56.0 | 2.4 | 2.1 | 5.2 | 12 | X |
| Comparative Example 10 | | HEDP | 3.5 | 2.4 | 2.1 | 5.1 | 11 | X |
| Comparative Example 11 | | HEDP | — | 2.4 | 2.0 | 3.8 | 10 | X |
| Comparative Example 12 | | HEDP | — | 2.4 | 3.8 | 5.0 | 32 | X |

Phytic acid (another name: myo-inositol-1,2,3,4,5,6-hexaphosphate)
HEDP ethane-1-hydroxy-1,1-diphosphonic acid (another name: 1-hydroxyethylidene-1,1-diphosphonic acid)
NTMP nitrilotris (methylenephosphonic acid)
EDTMP ethylenediaminetetra (methylenephosophonic acid)

As shown in Table 1, it was shown that the concentrated liquid according to the present invention had sufficient redispersibility.

As a result of comparison among Examples 1 and 9 to 11, it was found that the lower the pH of the concentrated liquid (the higher the amount of phosphorus-containing acid as the second dispersion stabilizer), the better the redispersibility. This is considered to be because as the amount of phosphorus-containing acid in the system increases, the amount of acid adsorbed on the abrasive grains also increases, and the ratio of abrasive grains in a loosely aggregated state (flock) to those in a strongly aggregated state (cake) increases.

As a result of comparison among Examples 1 and 15 to 19, it was found that the higher the amount of the first dispersion stabilizer, the better the redispersibility. From this result, it was suggested that the bulkiness of colloidal alumina contributed to the redispersibility, in addition to the electrostatic repulsive force between the particles.

As a result of comparison among Examples 1, 7, 8 and 13 to 15, it was found that the polishing rate of the epoxy resin increased as the average particle size of the abrasive grains/the major axis (A/B) of the first dispersion stabilizer was large. Although it is already known that the polishing rate is improved by increasing the average particle size of the abrasive grains, additionally, it was considered that a reduction in polishing performance due to the first dispersion stabilizer could be prevented by making the major axis of the first dispersion stabilizer relatively small.

As a result of comparison among Examples 1 to 5, the redispersibility and the balance between polishing rate and etching rate were better when the phosphonic acid-based phosphorus-containing acid was used as the second dispersion stabilizer.

This application is based on Japanese Patent Application No. 2020-105176 filed on Jun. 18, 2020, the disclosure of which is incorporated by reference in its entirety.

What is claimed is:

1. A concentrated liquid of a polishing composition comprising:
   particulate alumina;
   colloidal alumina having an aspect ratio of more than 5 and 800 or less;
   at least one phosphorus-containing acid selected from the group consisting of phosphoric acid, phosphoric acid condensates, organic phosphoric acids, phosphonic acids, and organic phosphonic acids; and
   water
   wherein a pH of the concentrated liquid of the polishing composition is 2 or more and 4.5 or less, and
   wherein a shape of the colloidal alumina is feathery.

2. The concentrated liquid according to claim 1, wherein an electrical conductivity is 1.5 mS/cm or more and 3.0 mS/cm or less.

3. The concentrated liquid according to claim 1, wherein an average major axis of the colloidal alumina is 50 nm or more and 5000 nm or less.

4. The concentrated liquid according to claim 1, wherein a ratio of the average particle size of the particulate alumina to the average major axis of the colloidal alumina is 0.5 or more and 50 or less.

5. The concentrated liquid according to claim 1, wherein a concentration of the particulate alumina is 2% by mass or more and 40% by mass or less.

6. The concentrated liquid according to claim 1, wherein a concentration of the colloidal alumina is 0.01% by mass or more and 20% by mass or less.

7. The concentrated liquid according to claim 1, wherein a content of the colloidal alumina is 0.1 parts by mass or more and 70 parts by mass or less relative to 100 parts by mass of a content of the particulate alumina.

8. The concentrated liquid according to claim 1, wherein the phosphorus-containing acid is at least one selected from the group consisting of organic phosphonic acids.

9. A polishing composition obtained by 2 to 20-fold dilution of the concentrated liquid according to claim 1 on a mass basis using a dispersing medium.

10. A polishing method comprising polishing an object to be polished containing a resin and a metal by using the concentrated liquid according to claim 9.

11. A method of manufacturing an electronic circuit board, comprising the polishing method according to claim 10.

12. The concentrated liquid according to claim 1, wherein the phosphorus-containing acid is at least one selected from the group consisting of organic phosphoric acids, phosphonic acids, and organic phosphonic acids.

13. The concentrated liquid according to claim 1, wherein the phosphorus-containing acid is at least one selected from the group consisting of phosphonic acids, and organic phosphonic acids.

14. The concentrated liquid according to claim 1, wherein the phosphorus-containing acid is at least one selected from the group consisting of pyrophosphoric acid, tripolyphosphoric acid, tetrapolyphosphoric acid, hexametaphosphoric acid, methyl acid phosphate, ethyl acid phosphate, ethylene glycol acid phosphate, isopropyl acid phosphate, phytic acid (myo-inositol-1,2,3,4,5,6-hexaphosphate), 1-hydroxyethylidene-1,1-diphosphonic acid (HEDP), nitrilotris (methylenephosphonic acid) (NTMP), ethylenediaminetetra (methylenephosophonic acid) (EDTMP), diethylenetriamine penta (methylenephosphonic acid), ethane-1,1-diphosphonic acid, ethane-1,1,2-triphosphonic acid, ethane-1-hydroxy-1,1-diphosphonic acid, ethane hydroxy-1,1,2-triphosphonic acid, ethane-1,2-dicarboxy-1,2-diphosphonic acid, and methanehydroxyphosphonic acid.

15. The concentrated liquid according to claim 1, wherein the phosphorus-containing acid is at least one selected from the group consisting of 1-hydroxyethylidene-1, 1-diphosphonic acid (HEDP), nitrilotris (methylenephosphonic acid) (NTMP), and ethylenediaminetetra (methylenephosophonic acid) (EDTMP).

16. The concentrated liquid according to claim 1, wherein an average particle size of the particulate alumina is 0.5 μm or more and 5 μm or less.

\* \* \* \* \*